US009362865B2

(12) United States Patent
Kamata et al.

(10) Patent No.: US 9,362,865 B2
(45) Date of Patent: Jun. 7, 2016

(54) DEMODULATION DEVICE, DEMODULATION METHOD AND PROGRAM

(71) Applicant: SONY CORPORATION, Tokyo (JP)

(72) Inventors: Hiroyuki Kamata, Kanagawa (JP); Yuichi Hirayama, Chiba (JP); Misa Nakane, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/369,040

(22) PCT Filed: Jan. 25, 2013

(86) PCT No.: PCT/JP2013/051526
§ 371 (c)(1),
(2) Date: Jun. 26, 2014

(87) PCT Pub. No.: WO2013/115074
PCT Pub. Date: Aug. 8, 2013

(65) Prior Publication Data
US 2015/0022263 A1    Jan. 22, 2015

(30) Foreign Application Priority Data

Feb. 2, 2012    (JP) .................................. 2012-020868

(51) Int. Cl.
*H03D 3/00* (2006.01)
*H04L 27/22* (2006.01)
*H04L 27/38* (2006.01)
*H04L 1/00* (2006.01)
*H04L 27/00* (2006.01)

(52) U.S. Cl.
CPC .............. *H03D 3/007* (2013.01); *H04L 1/0047* (2013.01); *H04L 27/22* (2013.01); *H04L 27/38* (2013.01); *H03D 2200/005* (2013.01); *H04L 2027/0065* (2013.01)

(58) Field of Classification Search
CPC ........................................................ H04L 27/22
USPC .......................................... 375/329; 329/327
See application file for complete search history.

(56) References Cited

U.S. PATENT DOCUMENTS

2009/0220249 A1*    9/2009    Mizuguchi .................... 398/202
2010/0119014 A1     5/2010    Futami et al.

FOREIGN PATENT DOCUMENTS

| JP | 6-296186   | A | 10/1994 |
| JP | 9-247226   | A | 9/1997  |
| JP | 11-340860  | A | 12/1999 |
| JP | 2000-13458 | A | 1/2000  |
| JP | 2008-278173| A | 11/2008 |

OTHER PUBLICATIONS

International Search Report issued Apr. 23, 2013 in PCT/JP2013/051526.

* cited by examiner

*Primary Examiner* — Joseph Chang
(74) *Attorney, Agent, or Firm* — Oblon, McClelland, Maier & Neustadt, L.L.P.

(57) ABSTRACT

The present technique relates to a demodulation device, a demodulation method and a program capable of realizing a demodulation process at a rate equivalent to a case where I and Q channel signals are not inverted, even when the I and Q channel signals are inverted. A frequency correction unit establishes synchronization of a frequency and clock based on a signal from a frequency synchronization unit. A channel inversion detection unit of a frame synchronization unit detects presence or absence of inversion of I and Q channel signals, and supplies, as a detection result, a channel inversion detection result to the channel inversion control unit. The channel inversion control unit switches the I and Q channel signals if the inversion has occurred, based on the channel inversion detection result. This technique can be applied to a demodulation device.

6 Claims, 10 Drawing Sheets

ALTERNATELY SEND SYMBOLS AT TRANSMISSION

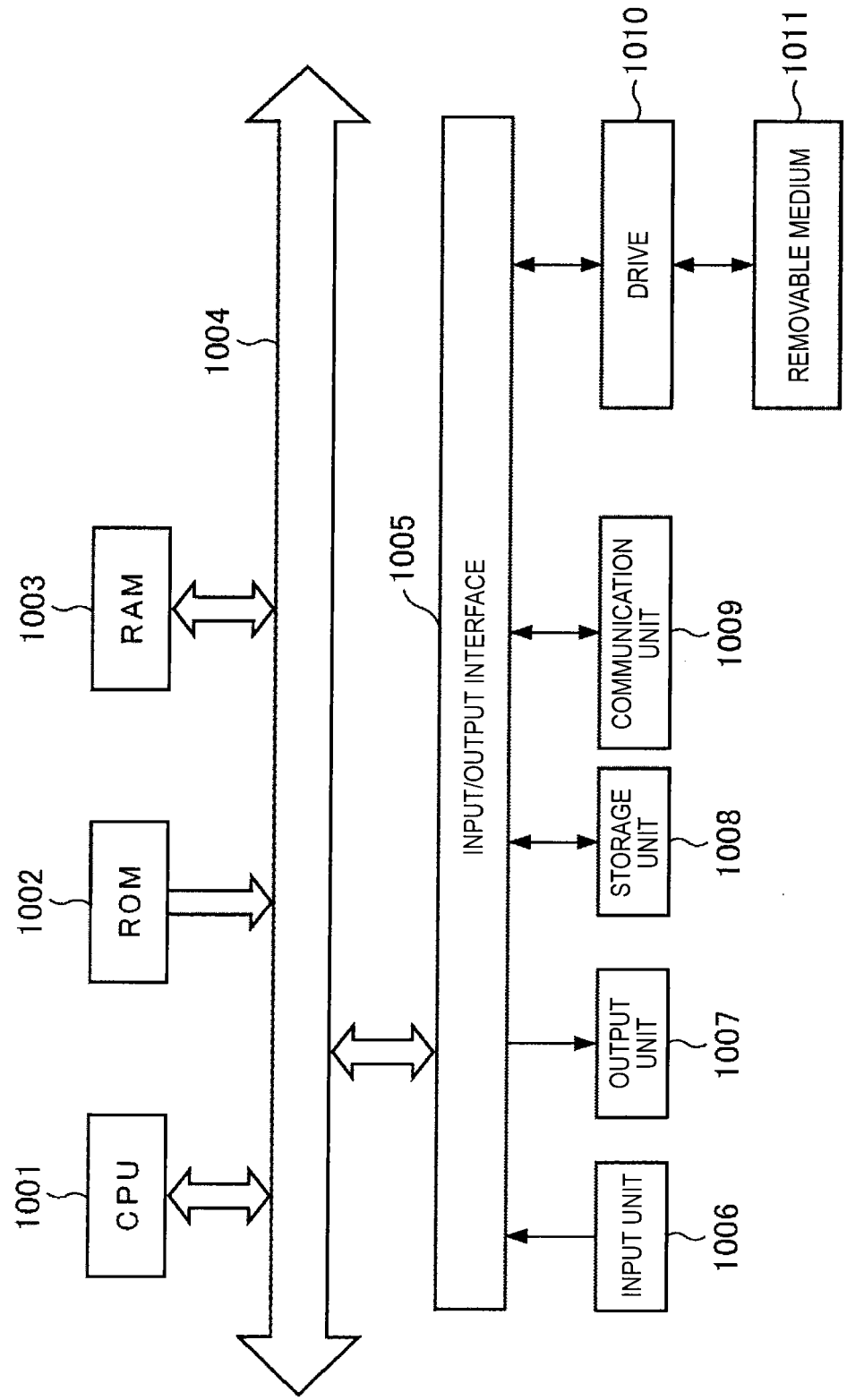

DEMODULATION DEVICE, DEMODULATION METHOD AND PROGRAM

TECHNICAL FIELD

The present technique relates to a demodulation device, a demodulation method and a program, and in particular, relates to a demodulation device, a demodulation method and a program capable of realizing a demodulation process at a rate equivalent to a case where an I channel and a Q channel are not inverted, even when the I channel and the Q channel are inverted.

BACKGROUND ART

A tuner that receives a digitally modulated signal inputs a signal to a demodulation device that demodulates a digitally modulated signal, and an I channel (in-phase component) and a Q channel (quadrature component) of the input signal may be inverted, preventing normal demodulation of the input signal as it is.

Therefore, techniques have been proposed for fixing the inversion within the demodulation device when the channels of the input signal are inverted (for instance, see Patent Literature 1 and Patent Literature 2). In particular, a technique to quickly detect channel inversion has been proposed in Patent Literature 2.

CITATION LIST

Patent Literature

Patent Literature 1: JP H5-160863A
Patent Literature 2: JP 2008-278173 A

SUMMARY OF INVENTION

Technical Problem

However, the technique of Patent Literature 2 switches the channels (also referred to as inversion control) and reprocesses all from the beginning after detecting the channel inversion, in order to perform demodulation process. Therefore, due to the need to reestablish the synchronization of the frequency and clock each time the channels are switched, demodulation process time sometimes becomes longer when the inversion of the channels has occurred than when there is no inversion of the channels.

The present technique has been devised in view of the above circumstances, and is intended, in particular when channels are inverted, to realize a demodulation process at a rate equivalent to a case where channels are not inverted, even when channels are inverted, through performing the inversion control to the downstream process which is the clock synchronization or the frequency synchronization.

Solution to Problem

According to an aspect of the present disclosure, there is provided a demodulation device that demodulates an input signal split into two signals of an I channel and a Q channel, the demodulation device including a frequency correction unit that corrects a frequency of the input signal and synchronizes the frequency, an inversion detection unit that detects the I channel and the Q channel of the input signal are inverted, and a channel control unit that switches, if it is detected that the channel and the Q channel are inverted by the inversion detection unit, the I channel and the Q channel at a downstream of the frequency correction unit.

The channel control unit may switch channels of the input signal at timing from which a frame of the input signal changes.

The channel control unit may again switch channels of the input signal, if frame synchronization to the input signal is not established within a predetermined time period after switching channels of the input signal.

According to an aspect of the present disclosure, there is provided a demodulation method of a demodulation device that demodulates an input signal split into two signals of an I channel and a Q channel, the demodulation method including the steps of executing a frequency correction process that corrects frequency of the input signal and synchronizes the frequency, executing an inversion detection process that detects the I channel and the Q channel of the input signal are inverted, and executing a channel control process that switches, if it is detected that the I channel and the Q channel are inverted in the inversion detection process, the I channel and the Q channel in a downstream process of the frequency correction process.

According to an aspect of the present disclosure, there is provided a program for causing a computer controlling a demodulation device that demodulates an input signal split into two signals of an I channel and a Q channel, to function as a frequency correction unit that corrects a frequency of the input signal and synchronizes the frequency, an inversion detection unit that detects the I channel and the Q channel of the input signal are inverted, and a channel control unit that switches, if it is detected that the I channel and the Q channel are inverted by the inversion detection unit, the I channel and the Q channel at a downstream of the frequency correction unit.

According to one aspect of the present technique, there is provided a frequency correction unit that corrects the frequency of an input signal and synchronizes the frequency, and inversion of the I channel and the Q channel being the input signal is detected. When the inversion of the I channel and the Q channel is detected, in a process subsequent to a configuration for establishing synchronization by frequency correction, the I channel and the Q channel are switched.

A demodulation device of the present technique may be an independent device, or may be a block that performs a demodulation process.

Advantageous Effects of Invention

According to one aspect of the present technique, even if the I channel signal and the Q channel signal are input under an inverted state, it is possible to realize a demodulation process at a rate equivalent to that in a non-inverted state.

BRIEF DESCRIPTION OF DRAWINGS

FIG. 10 is a diagram for explaining a configuration example of a general-purpose personal computer.

DESCRIPTION OF EMBODIMENTS

Configuration Example of Demodulation Device

Figure 1:
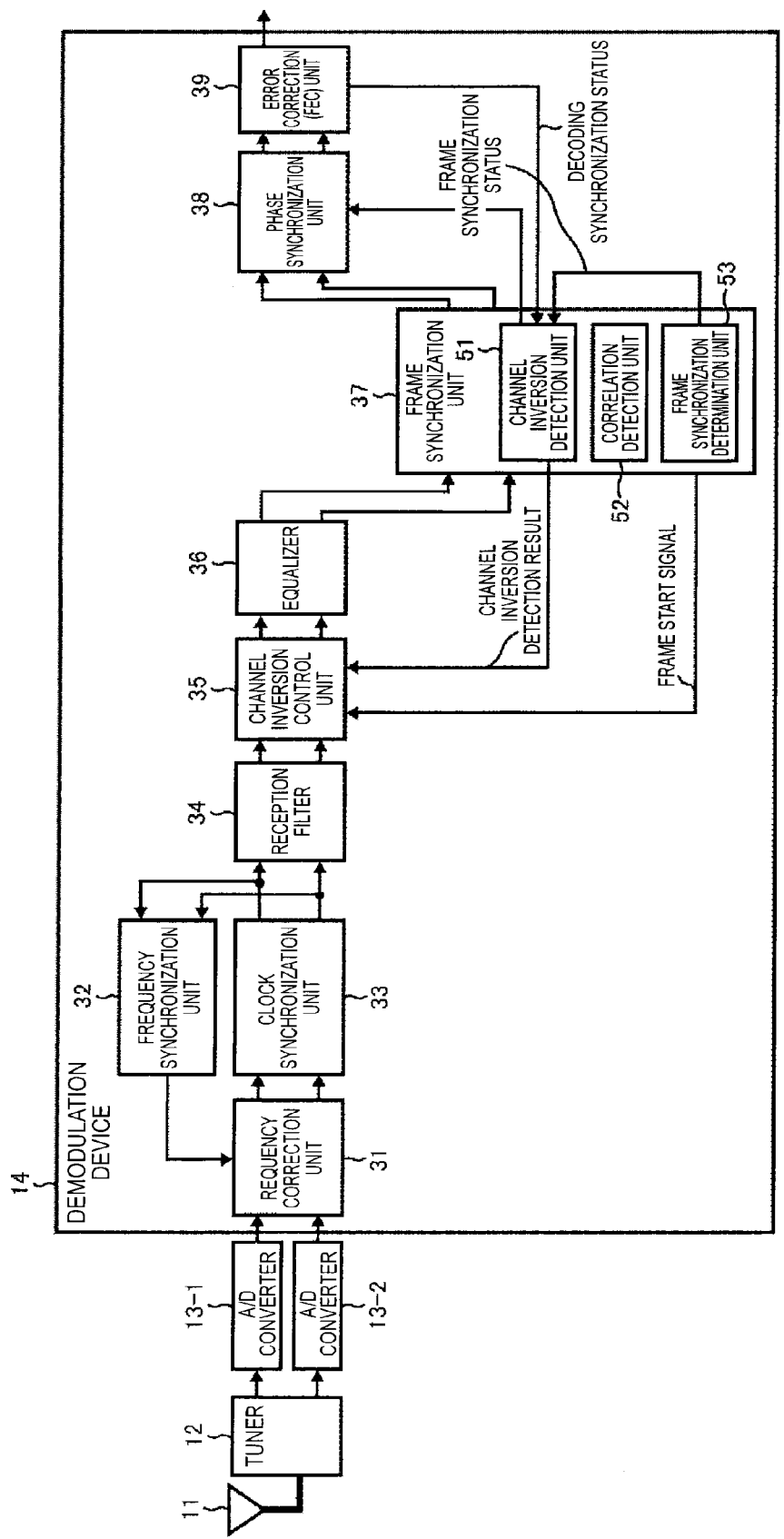
FIG. 1 is a block diagram showing a configuration example of an embodiment of a demodulation device according to the present technique.

FIG. 1 is a block diagram illustrating an embodiment of a receiving system including a demodulation device according to the present technique. The reception system of FIG. 1 is a system for receiving and demodulating a broadcast signal that are in conformity with DVB-S.2 standard (hereinafter also referred to as input signal).

The DVB-S.2 standard is a standard above DVB-S standard standardized by ETSI (European Telecommunications Standards Institute) for general use. The DVB-S.2 standard, as compared with the DVB-S standard, seeks to improve efficiency of frequency utilization and to improve C/N ratio (Carrier to Noise ratio) per frequency unit, through introducing multiple phase shift keying or LDPC (Low Density Parity Check) code. Further, synchronization pilot signal or PL (physical layer) header for transmitting the transmission information on a physical layer has been introduced as a standard, in order to ensure synchronization performance at low C/N ratio.

Figure 2:
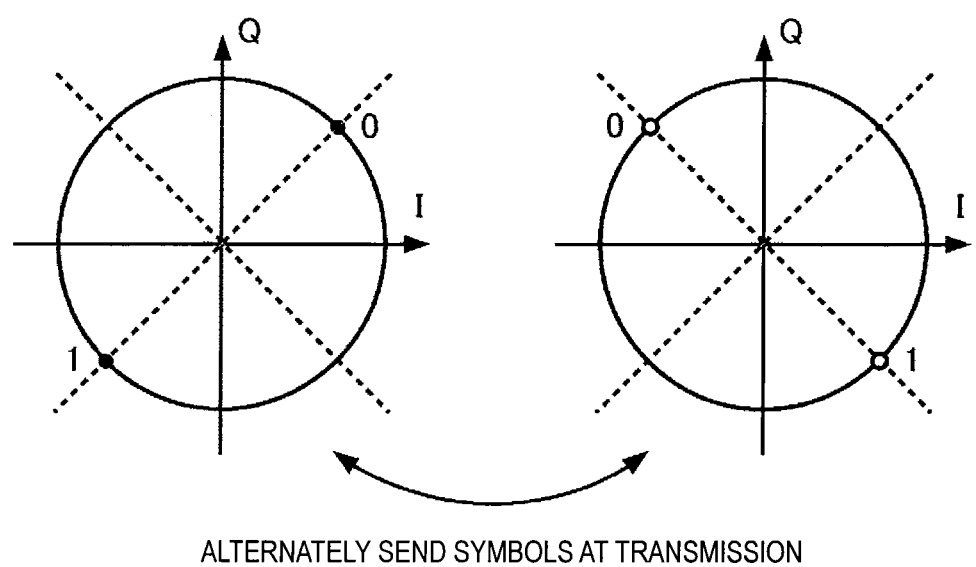
FIG. 2 is a diagram showing a mapping pattern in a complex plane for each symbol in π/2 shift BPSK.

In the DVB-S.2 standard, the PL header and the synchronization pilot signal are modulated by π/2 shift BPSK (Binary Phase Shift Keying) and transmitted. FIG. 2 is a view showing a mapping pattern for each symbol in the π/2 shift BPSK on a complex plane. A mapping pattern of odd numbered symbols is shown on the left side of FIG. 2, and a mapping pattern of even numbered symbols is shown on the right side thereof. That is, on the complex plane, the odd numbered symbols are mapped in such a manner that the argument is π/4 when the value is zero, and the argument is 5π/4 when the value is one, and the even numbered symbols are mapped in such a manner that, the argument is 37π/4 when the value is zero, and the argument is 7π/4 when the value is one. Therefore, the phase difference between the adjacent symbols is limited to ±π/2.

Referring back to FIG. 1, the receiving system is configured to include an antenna 11, a tuner 12, A/D converters 13-1, 13-2, and a demodulation device 14.

The tuner 12 receives an input signal conforming to the DVB-S.2 standard via the antenna 11, separates the received input signal into two signals of I channel and Q channel, and supplies the separated signals to the A/D converters 13-1, 13-2, respectively. Hereinafter, a signal of the I channel is also referred to as an I channel signal, and a signal of the Q channel is also referred to as a Q channel signal.

The A/D converters 13-1 and 13-2 convert the I channel signal or the Q channel signal being an input signal from an analog signal into a digital signal, and supplies the converted signal to a frequency correction unit 31 of the demodulation device 14.

The demodulation device 14 is structured to include a frequency correction unit 31, a frequency synchronization unit 32, a clock synchronization unit 33, a reception filter 34, a channel inversion control unit 35, an equalizer 36, a frame synchronization unit 37, a phase synchronization unit 38, and an error correction unit 39.

According to the correction signal supplied from the frequency synchronization unit 32, the frequency correction unit 31 corrects the frequency of the input signal, and supplies the corrected input signal to the clock synchronization unit 33. The clock synchronization unit 33 synchronizes, with the clock signal, the input signal whose frequency is corrected by the frequency correction unit 31, supplies the synchronized input signal to the frequency synchronization unit 32 and the reception filter 34. The frequency synchronization unit 32 obtains a correction amount that is required to synchronize the frequency of the input signal with a predetermined frequency, and supplies the frequency correction unit 31 with the obtained correction amount as a correction signal. In other words, synchronization of the clock and the frequency of the input signal is established by a loop of the frequency correction unit 31, the frequency synchronization unit 32 and the clock synchronization unit 33.

The reception filter 34 is, for example, a roll-off filter, and provides the channel inversion control unit 35 with the result of the filtering.

According to the channel inversion detection result supplied from a channel inversion detection unit 51 of the frame synchronization unit 37, the channel inversion control unit 35 switches and outputs the I channel signal and the Q channel signal being the input signal supplied from the reception filter 34. Further, if it is necessary to switch the I channel signal and the Q channel signal according to the channel inversion detection result, the channel inversion control unit 35 switches the I channel signal and the Q channel signal, at the timing of obtaining a frame start signal supplied from a frame synchronization determination unit 53 of the frame synchronization unit 37, and supplies the switched I channel signal and the Q channel signal to the equalizer 36.

The equalizer 36 restores each component degraded on the transmission path associated with the transmission with regard to the I channel signal and the Q channel signal supplied from the channel inversion control unit 35, and supplies the restored I channel signal and Q channel signal to the frame synchronization unit 37.

The frame synchronization unit 37 performs synchronization control to the input signal per frame unit. The frame synchronization unit 37 supplies the phase synchronization unit 38 with the input signal supplied from the equalizer 36 as it is. Further, the frame synchronization unit 37 includes the channel inversion detection unit 51, a correlation detection unit 52, and the frame synchronization determination unit 53, and performs channel control along with the synchronization control.

The channel inversion detection unit 51 detects whether or not the phases of I channel and Q channel of the signal to be output to the phase synchronization unit 38 are in a right relation, i.e., the phase of Q channel is delayed by π/2 with respect to the phase of I channel. More specifically, the channel inversion detection unit 51 detects whether or not the relation of the phases of the I and Q channels are correct according to the correlation value from the correlation detection unit 52, the determination result of the reliability of the correlation value, a synchronization state of the frame notified from the frame synchronization determination unit 53, or the state of the decoding synchronization by the error correction process which is notified from the error correction unit 39. Then, the channel inversion detection unit 51 supplies the channel inversion control unit 35 with the detection result as the channel inversion detection result. Based on the channel inversion detection result, when the phase relation is not correct and needs switching, the channel inversion control unit 35 switches the channels of the input signal.

As used herein, the term switching the channels of the input signal means that reversing the phase relation of the I channel signal and the Q channel signal input to the channel inversion control unit 35 from the reception filter 34. For example, methods of switching the channels of the input signal includes a method such as switching, by a selector, the signal output from each output terminal, and a method of reversing, by an inverter, the phases by inverting the polarity of one of the signals output from each output terminal.

The correlation detection unit 52 performs delay detection to the complex symbol sequence of the input signal (hereinafter, also referred to as a received sequence), through performing complex multiplication of the complex conjugate of the symbol preceding the current symbol and the current symbol. The correlation detection unit 52 correlates a symbol sequence of the received delay detection value (hereinafter, also referred to as a received delay detection sequence), and a symbol sequence (hereinafter, also referred to as a known delay detection sequence) of a correct delay detection value (hereinafter, also referred to as a known delay detection value) of a symbol sequence of a known value (hereinafter, also referred to as a known sequence) that is periodically inserted in the input signal, such as a portion of the PL header or a synchronization pilot signal, and supplies the resulting correlation value to the channel inversion detection unit 51 and the frame synchronization determination unit 53. The correlation detection unit 52 determines the reliability of the correlation value, and notifies the channel inversion detection unit 51 of the determination result.

In the following, an explanation is given assuming that the correlation detection unit 52 calculates, regarding a sequence SOF (Start Of Frame) in PL header inserted at the beginning of each header in the input signal as a known sequence, the correlation value between the known delay detection sequence corresponding to the known sequence and the received delay detection sequence.

The frame synchronization determination unit 53 detects a peak value of the correlation value appearing in a frame period and the timing thereof (hereinafter, also referred to as peak timing).

The frame synchronization determination unit 53 synchronizes the input signal for a frame unit according to a peak value and peak timing of the detected correlation value. The frame synchronization determination unit 53 supplies a frame synchronization status, and a signal indicating the peak timing of the correlation value to the channel inversion detection unit 51. Further, the frame synchronization determination unit 53 supplies the phase synchronization unit 38 with a frame synchronization status and a signal indicating, for example, the top position of each frame of the input signal. Furthermore, the frame synchronization determination unit 53 supplies the channel inversion control unit 35, as a frame start signal, information of the top position of each frame.

The phase synchronization unit 38 corrects the phase error of each symbol of the input signal, and supplies the corrected signal to the error correction unit 39.

The error correction unit 39 applies, to the input signal, LDPC or BCH decoding, or error correction (FEC (Forward Error Correction)), etc. such as Viterbi decoding, Reed-Solomon decoding, etc., and TS (Transport stream) packets obtained as a result is output to a downstream device. Further, the error correction unit 39 supplies the channel inversion detection unit 51 of the frame synchronization unit 37 with a signal indicating the decoding synchronization status resulting from an error correction and decoding process.

[Demodulation Process]

Next will be described a demodulation process by the receiving system of FIG. 1 with reference to the flowchart of FIG. 3.

In step S1, the tuner 12 receives an input signal in conformity with the DVB-S.2 standard via the antenna 11, splits the received input signal into two signals of I and Q channels, and supplies the A/D converters 13-1 and 13-2 therewith.

In step S2, the A/D converters 13-1 and 13-2 convert the input I channel signal or Q channel signal from an analog signal into a digital signal, and supply the converted signals to the frequency correction unit 31 of the demodulation device 14.

In step S3, the frequency correction unit 31 corrects the frequency of the input I channel and Q channel signal converted into a digital signal, according to the correction signal indicating the correction amount supplied from the frequency synchronization unit 32, and supplies the I channel signal and the Q channel signal to the clock synchronization unit 33.

In step S4, the clock synchronization unit 33 synchronizes, with a predetermined clock signal, the I channel signal and the Q channel signal converted into a digital signal, corrected with regards to the frequency thereof, and supplied from the frequency correction unit 31, and supplies the I channel signal and the Q channel signal to the frequency synchronization unit 32 and the reception filter 34.

In step S5, the frequency synchronization unit 32 generates a signal indicating a correction amount of the frequency of the I channel signal and the Q channel signal synchronized to the clock, and supplies the signal to the frequency correction unit 31.

That is, the same process is repeated by a loop constituted by the frequency correction unit 31, the frequency synchronization unit 32 and the clock synchronization unit 33, so that the frequency and clock synchronization is established. However, generally, with regard to the frequency and clock synchronization, once a condition is established, the established condition is continued.

In step S6, the reception filter 34 applies, for example, a roll-off filter to the I channel signal and the Q channel signal with synchronized frequency and clock, which are supplied from the clock synchronization unit 33, and supplies the I channel signal and the Q channel signal to the channel inversion control unit 35.

Figure 6:
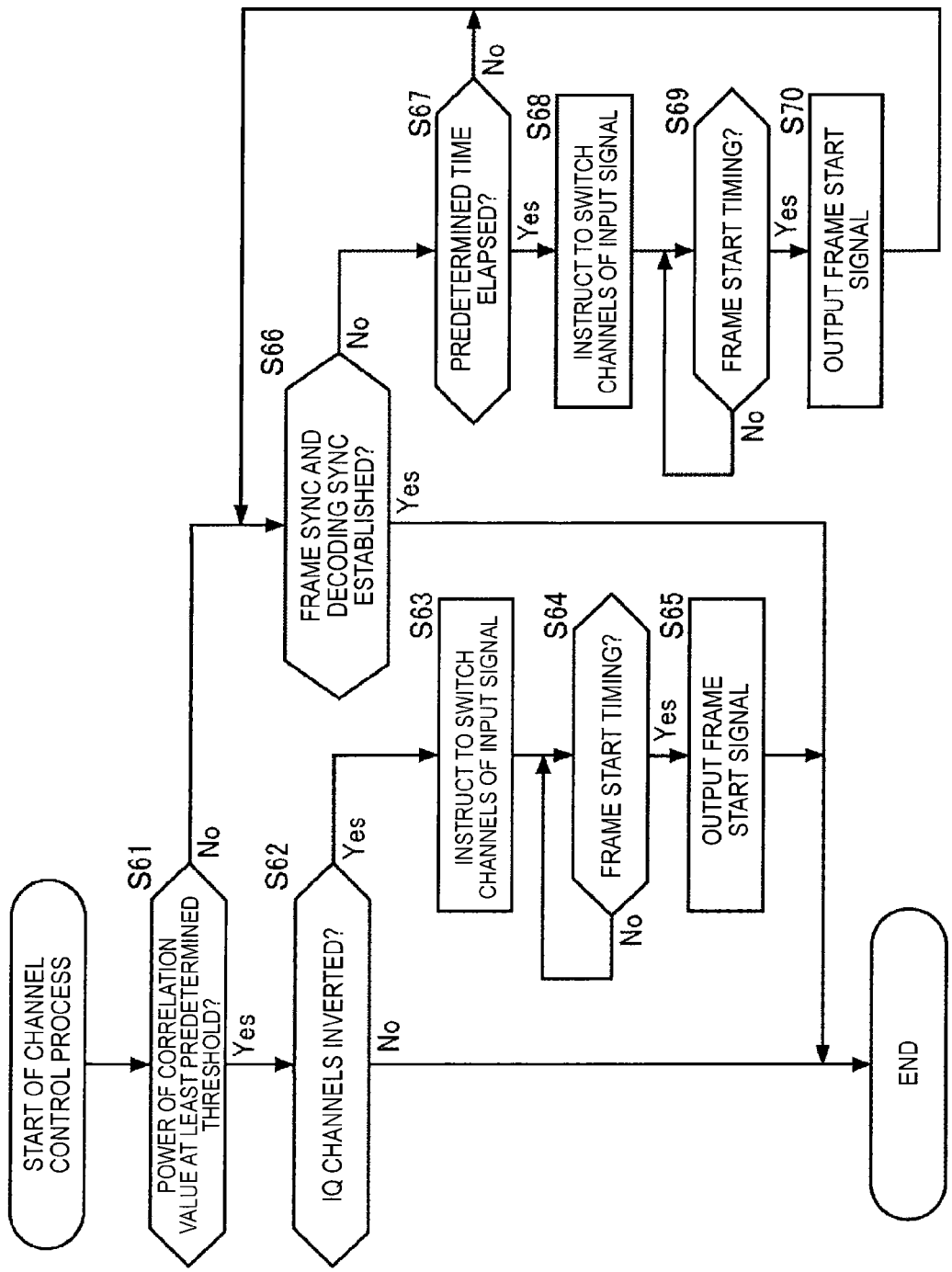
FIG. 6 is a flow chart for explaining a channel control process executed by the demodulation device of FIG. 1.

In step S7, the channel inversion control unit 35 determines whether or not there has been supplied a channel inversion detection result indicating that the I channel signal and the Q channel signal are inverted by the channel inversion detection unit 51 of the frame synchronization unit 37. In step S8, for example, if the process of steps S63 and S68 in FIG. 6 described below has supplied, from the channel inversion detection unit 51, the channel inversion detection result indicating that the I channel signal and the Q channel signal are inverted, the process proceeds to step S8.

In step S8, the channel inversion control unit 35 determines whether or not a frame start signal has been supplied from the frame synchronization determination unit 53, and repeats the same process until the frame start signal is transmitted. Then, in step S8, when a frame start signal is supplied thereto by the processes of, for example, steps S65, S70 of FIG. 6 described below, the process proceeds to step S9.

In step S9, the channel inversion control unit 35 inverts the I channel signal and the Q channel signal supplied from the reception filter 34 and supplies the inverted I channel signal and Q channel signal to the equalizer 36.

Meanwhile, in step S7, if there has not been supplied a channel inversion detection result indicating that the I channel signal and the Q channel signal are inverted, from the channel inversion detection unit 51 of the frame synchronization unit 37, the process proceeds to step S10.

In step S10, the channel inversion control unit 35 supplies, to the equalizer 36, the I channel signal and the Q channel signal supplied from the reception filter 34 as they are without inverting.

In step S11, the equalizer 36 restores components degraded on the transmission path associated with the transmission, respectively, of the I channel signal and the Q channel signal supplied from the channel inversion control unit 35, and supplies the restored I channel signal and Q channel signal to the frame synchronization unit 37.

In step S12, the frame synchronization unit 37 executes the frame synchronization process, synchronizes the input signal frame by frame, and supplies, to the phase synchronization unit 38, the input signal supplied from the equalizer 36 as it is.

[Synchronization Process]

Figure 4:
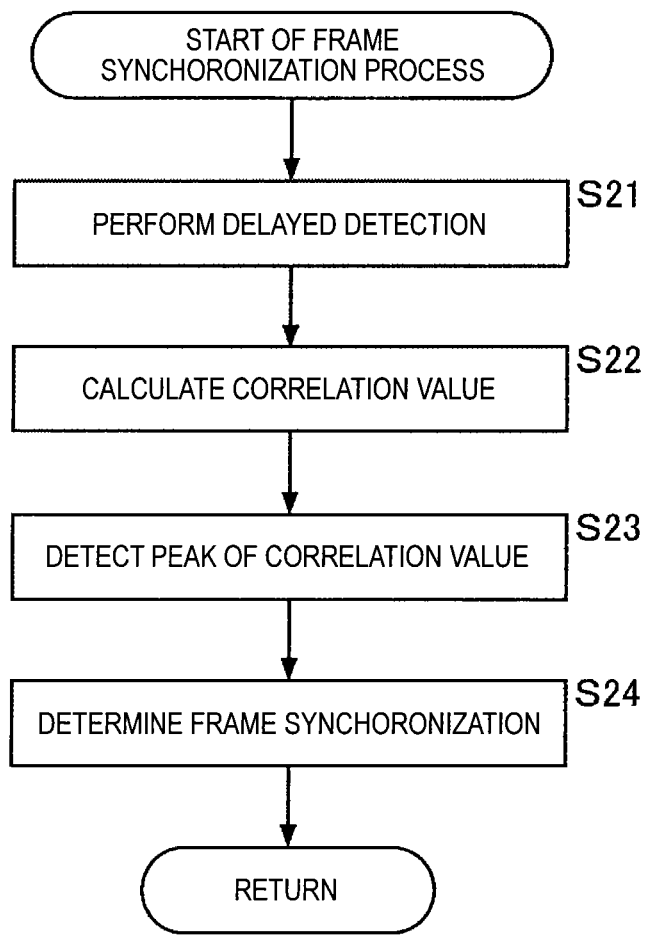
FIG. 4 is a flowchart for explaining a frame synchronization process performed by the demodulation device of FIG. 1.

Referring now to the flowchart of FIG. 4, there will be described frame synchronization process by the frame synchronization unit 37.

In step S21, the correlation detection unit 52 performs delay detection. In particular, the correlation detection unit 52 performs delay detection by performing a complex multiplication of the complex conjugate of the current symbol and the delayed symbol which is one symbol before the current symbol to the input signal, and determines the received delay detection value.

In step S22, the correlation detection unit 52 calculates a correlation value. Specifically, the correlation detection unit 52 calculates a correlation value representing the correlation between a received delay detection sequence and a known delay detection sequence using the following mathematical expression (1):

[Math. 1]

$$\text{Correlation value} = \sum_{i=1}^{K} a_i \cdot d_i \quad (1)$$

$$a_i = \begin{cases} 1 : \text{if the } i\text{-th value in the known delay detection sequence is } j \\ -1 : \text{if the } i\text{-th value in the known delay detection sequence is } -j \end{cases}$$

Here, K is a value obtained by subtracting one from the number of symbols of the known sequence inserted in the beginning of each frame of the input signal. Further, $d_i$ denotes the i-th value in the received delay detection sequence.

The correlation detection unit 52 supplies the calculated correlation value to the frame synchronization determination unit 53 and the channel inversion detection unit 51.

Meanwhile, the difference between the correlation value when the channels of the input signal are not inverted and the correlation value when inverted is discussed.

First, the case where the channels of the input signal are not inverted is considered. In order to simplify the explanation, the value of the known sequence inserted in the input signal is regarded as 0011, and then the value of the known delay detection sequence corresponding to the known sequence is regarded as j, j, j.

Figure 5:
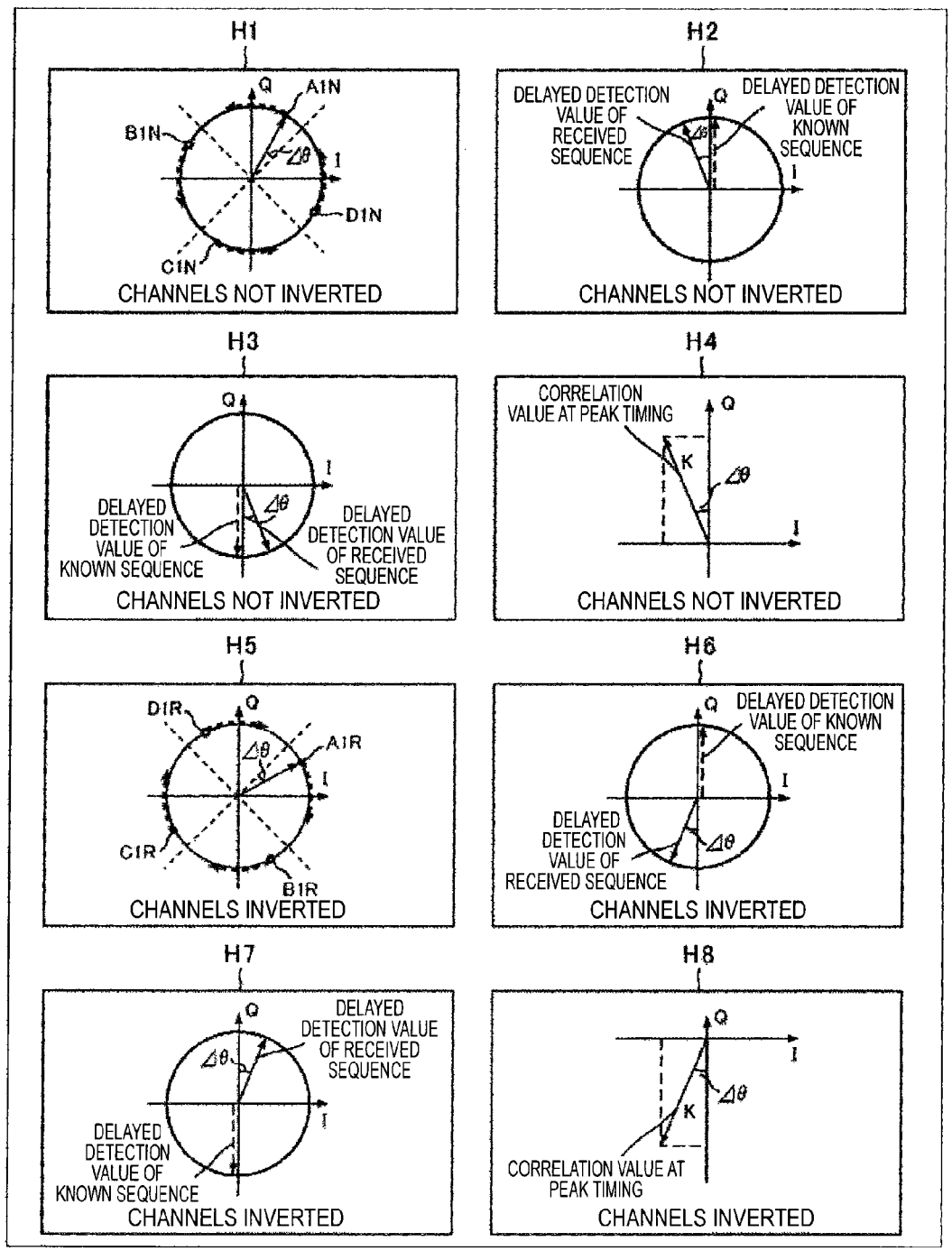
FIG. 5 is a diagram showing a relation of presence or absence of inversion in the channels of the input signal, reception points on the complex plane when a known sequence inserted into the input signal is received, a known delay detection value and a received delay detection value of a received sequence corresponding to the known sequence.

The complex plane H1 of FIG. 5 shows reception points on the complex plane upon receiving a known sequence inserted in the input signal with the channels of the input signal not inverted. If it is assumed that a symbol in the beginning of the known sequence is a symbol A1, the second symbol is a symbol B1, the third symbol is a symbol C1, and the fourth symbol is a symbol D1, the reception points on the complex plane in the received sequences corresponding to the symbols A1, B1, C1 and D1 are:

point A1N $(\cos(\pi/4+\Delta\theta), j\sin(\pi/4+\Delta\theta))$,
point B1N $(-\sin(\pi/4+2\Delta\theta), j\cos(\pi/4+2\Delta\theta))$,
point C1N $(-\cos(\pi/4+3\Delta\theta), -j\sin(\pi/4+3\Delta\theta))$ and
point D1N $(\sin(\pi/4+4\Delta\theta), -j\cos(\pi/4+4\Delta\theta))$, respectively.

Here, $\Delta\theta$ denotes the phase rotational angle per symbol caused by frequency error.

In the above case, the delay detection value between adjacent symbols in the received sequence corresponding to the known sequence (i.e., received delay detection value) is given as $B1N \cdot A1N^* = C1N \cdot B1N^* = D1N \cdot C1N^* = e^{j(\pi/2+\Delta\theta)}$, and as shown in the complex plane H2 in FIG. 5, the phase is rotated by $+\Delta\theta$ relative to the delay detection value of the known sequence (i.e., known delay detection value). Then, based on the expression (1) above, the correlation value between the known delay detection sequence and the received delay detection sequence corresponding to the known sequence, i.e., correlation value at peak timing, is defined by the following expression (2):

$$\text{Correlation value} = e^{j(\pi/2+\Delta\theta)} + e^{j(\pi/2+\Delta\theta)} + e^{j(\pi/2+\Delta\theta)} \quad (2)$$
$$= 3e^{j(\pi/2+\Delta\theta)}$$
$$= 3(\cos(\pi/2+\Delta\theta) + j\sin(\pi/2+\Delta\theta))$$

Thus, if the channels of the input signal are not inverted, the known delay detection value and the received delay detection value corresponding to the known sequence come closer to the same phase as the value of $\Delta\theta$ decreases, as shown in the complex planes H2 and H3 in FIG. 5, and positive correlation becomes higher.

Further, in an ideal reception environment, the correlation value at peak timing is $Ke^{j(\pi/2+\Delta\theta)}$ (where K is a value obtained by subtracting one from the number of symbols in the known sequence, the same as that in the expression (1)), and may be expressed, as shown in the complex plane of H4 in FIG. 5, at an angle of $+\Delta\theta$ relative to the positive direction of the Q axis.

Then, the case where the channels of the input signal are inverted is considered.

If the channels of the input signal are inverted, the rotation direction of the phase rotation angle per symbol caused by frequency error is in the opposite direction, compared with the case where the channels of the input signal are not inverted. Thus, as shown in the complex plane H5 in FIG. 5, upon receiving the sequence of symbols A1, B1, C1 and D1 in the above-described known sequence whose value is 0011, reception points on the complex plane are:

point A1R $(\cos(\pi/4-\Delta\theta), j\sin(\pi/4-\Delta\theta))$,
point B1R $(\sin(\pi/4-2\Delta\theta), -j\cos(\pi/4-2\Delta\theta))$,
point C1R $(-\cos(\pi/4-3\Delta\theta), -j\sin(\pi/4-3\Delta\theta))$ and
point D1R $(-\sin(\pi/4-4\Delta\theta), j\cos(\pi/4-4\Delta\theta))$, respectively.

In the above case, the received delay detection value of the received sequence corresponding to the known sequence is given as $B1R \cdot A1R^* = C1R \cdot B1R^* = D1R \cdot C1R^* = e^{j(\pi/2-\Delta\theta)}$. As shown in the complex plane H6 in FIG. 5, the phase is rotated by $\pi-\Delta\theta$ relative to the known delay detection value of the known sequence. Then, based on the expression (1) above, the correlation value between the known delay detection sequence and the received delay detection sequence corresponding to the known sequence is defined by the following expression (3):

$$\text{Correlation value} = e^{j(-\pi/2-\Delta\theta)} + e^{j(-\pi/2-\Delta\theta)} + e^{j(-\pi/2-\Delta\theta)} \quad (3)$$
$$= 3e^{j(-\pi/2-\Delta\theta)}$$
$$= 3(\cos(-\pi/2 - \Delta\theta) + j\sin(-\pi/2 - \Delta\theta))$$

Thus, as shown in complex planes H6 and H7 in FIG. 5, if the channels of the input signal are inverted, the known delay detection value and the received delay detection value corresponding to the known sequence come closer to the opposite phase as the value of Δθ decreases, and negative correlation becomes higher.

Further, in an ideal reception environment, the correlation value at peak timing is given as $Ke^{j(-\pi/2-\Delta\theta)}$, and can be expressed at an angle of −Δθ relative to the negative direction of the Q axis, as shown in the complex plane H8 in FIG. 5.

Referring back to FIG. 4, in step S23, the frame synchronization determination unit 53 detects a peak of the correlation value. Specifically, the frame synchronization determination unit 53 detects the peak value of the correlation value appearing at intervals of the frame period and the peak timing.

In step S24, the frame synchronization determination unit 53 performs frame synchronization determination. For example, if there has continued, in a predetermined time period, the state in which the peak value of the correlation value equal to or greater than a predetermined threshold appears at a predetermined frame period, the frame synchronization determination unit 53 determines that the frame synchronization has been established. The frame synchronization determination unit 53 then supplies the phase synchronization unit 38 and the channel inversion detection unit 51 with a signal indicating the status of frame synchronization, i.e., indicating the presence or absence of the establishment of frame synchronization. Further, if frame synchronization is found to be established, the frame synchronization determination unit 53 supplies the phase synchronization unit 38 with a signal indicating, for example, the top position of each frame in the input signal. Furthermore, the frame synchronization determination unit 53 supplies the channel inversion detection unit 51 with a signal indicating the peak timing of the correlation value.

Figure 3:
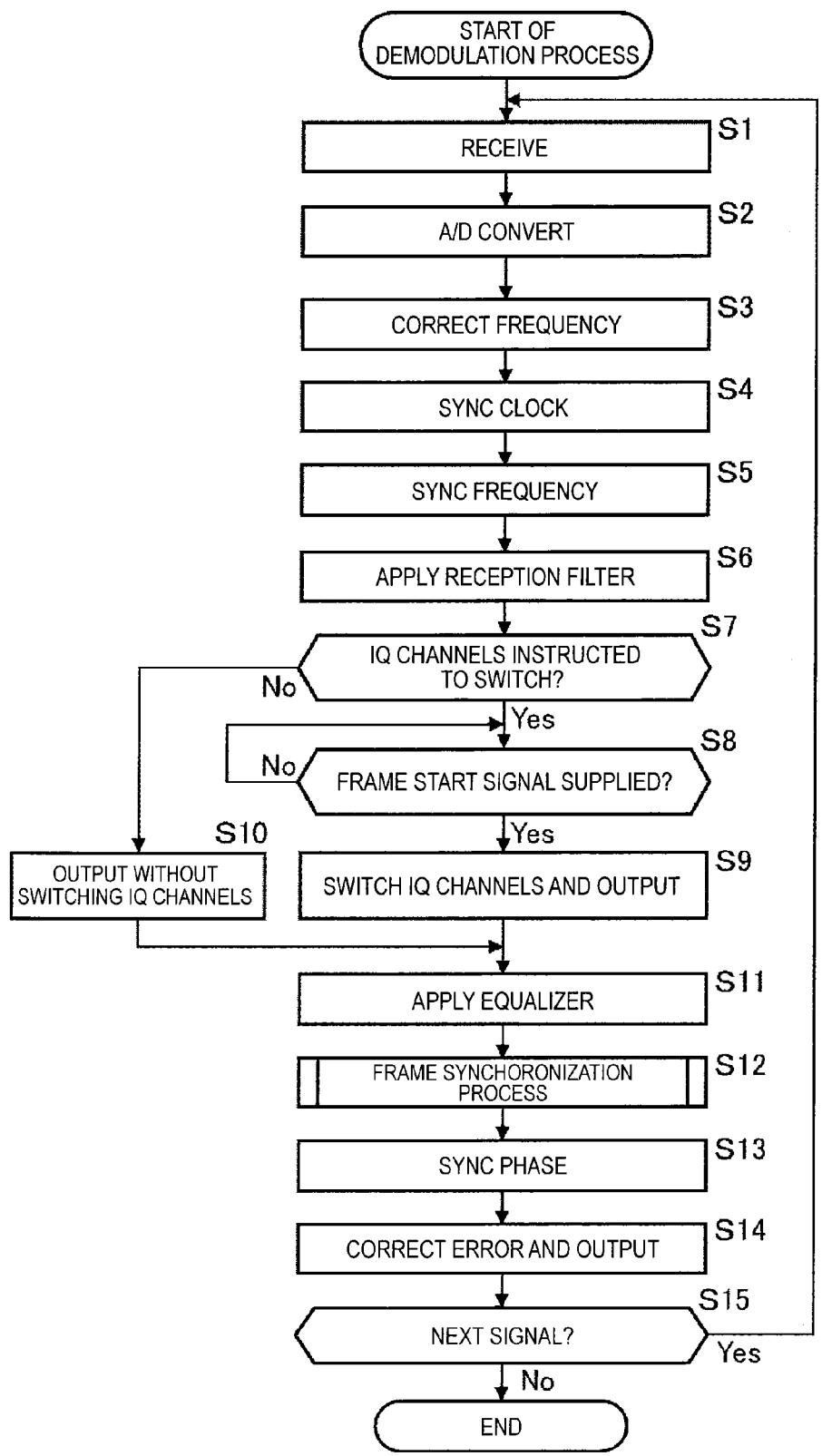
FIG. 3 is a flowchart for explaining a demodulation process performed by the demodulation device of FIG. 1.

Now, the explanation is returned to the flowchart in FIG. 3.

If the frame synchronization process is performed in step S12, the phase synchronization unit 38 corrects, in step S13, the phase error of each symbol of the input signal, and supplies the error correction unit 39 with the corrected signal.

In step S14, the error correction unit 39 performs, to the input signal, LDPC and BCH decoding, or an error correction process (FEC (Forward Error Correction)), etc. such as Viterbi decoding, Reed-Solomon decoding etc., and outputs the resulting TS (transport stream) packets to a downstream device. At this time, the error correction unit 39 supplies the channel inversion detection unit 51 of the frame synchronization unit 37 with a signal indicating the decoding synchronization status resulting from the error correction and decoding process.

In step S15, the tuner 12 determines whether or not the next signal is received via the antenna 11, and if it is determined that the next signal exists, the process returns to step S1, and the subsequent processes are repeated. If it is determined that there is no next signal in step S15, the process is terminated.

That is, the channel inversion control unit 35 is provided at the downstream configuration for establishing synchronization of a frequency and a clock signal, i.e., at the downstream of the frequency synchronization unit 32 and the clock synchronization unit 33. Therefore, even if the switching of the I channel signal and the Q channel signal is instructed, the channel inversion control unit 35 can maintain the state of the established synchronization of the frequency and the clock signal when switching the channels. As a result, in the demodulation process, even if the I channel signal and the Q channel signal are inverted, since it is not necessary to establish the synchronization of the frequency and the clock along with the switching of the I channel signal and the Q channel signal, the delay is not caused by the time required for the establishment of the synchronization. Therefore, it becomes possible to realize the demodulation process in the process time substantially equivalent to that in a case where the inversion of the Q channel signal and the I channel signal does not occur.

[Channel Control Process]

Next will be described the channel control process executed in relation to the demodulation process as described above, with reference to the flowchart of FIG. 6.

In step S61, the channel inversion detection unit 51 determines whether or not the power of the correlation value is equal to or larger than a predetermined threshold. The power of the correlation value becomes larger as the absolute value of the correlation value increases, and ideally the correlation value at peak timing is $K^2$. Conversely, the larger the power of the correlation value is, the larger the absolute value of the correlation value becomes. That is, there can be observed strong correlation between the known delay detection sequence and the received delay detection sequence, indicating high reliability of the correlation value. If it is determined that the power of the correlation value is equal to or greater than a predetermined threshold, the channel inversion detection unit 51 assumes that the reliability of the correlation value is high, and the process proceeds to step S62.

In step S62, the channel inversion detection unit 51 determines whether or not the I channel signal and the Q channel of the input signal are inverted. In particular, by determining whether or not the value of the imaginary part of the correlation value is equal to or greater than zero, the channel inversion detection unit 51 determines whether or not the I channel signal and the Q channel of the input signal are inverted.

Figure 7:
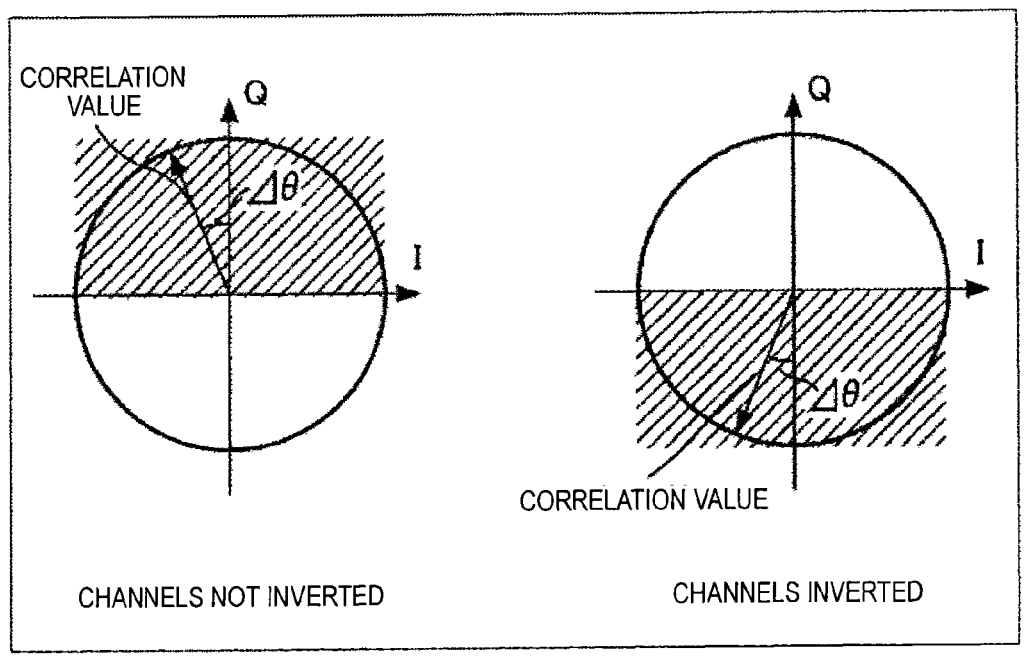
FIG. 7 is a diagram for explaining a determination process in step S62 in the flowchart of FIG. 6.

As described above with reference to the complex plane H4 in FIG. 5, if the channels of the input signal are not inverted, in an ideal reception environment, the correlation value at peak timing is given as $Ke^{j(\pi/2+\Delta\theta)}$. Whereas, as described above with reference to the complex plane H8 in FIG. 5, if the channels of the input signal are inverted, in an ideal reception environment, the correlation value at peak timing is given as $Ke^{j(-\pi/2-\Delta\theta)}$. Thus, if the channels of the input signal are not inverted and if Δθ falls within the range of ±π/2, the value of the imaginary part of the correlation value at peak timing is positive, and the correlation between the known delay detection sequence and the received delay detection sequence corresponding to the known sequence becomes a positive correlation, as shown in the shaded area in the left-hand view of FIG. 7. Whereas, if the channels of the input signal are inverted and if Δθ falls within the range of ±π/2, the value of the imaginary part of the correlation value at peak timing is negative, and the correlation between the known delay detection sequence and the received delay detection sequence corresponding to the known sequence is a negative correlation, as shown in the shaded area in the right-hand view of FIG. 7.

By utilizing this property, the channel inversion detection unit 51 determines that the channels of the input signal have been inverted, if the value of the imaginary part of the correlation value at peak timing is less than zero under the condition that $\Delta\theta$ falls within the range of $\pm\pi/2$, and then the process proceeds to step S63.

In step S63, the channel inversion detection unit 51 generates a channel inversion detection signal indicating occurrence of the inversion of the channels, and supplies the generated channel inversion detection signal to the channel inversion control unit 35. By this process, the channel inversion control unit 35 assumes that the switching of the I channel signal and the Q channel signal has been instructed with regard to the input signal successively supplied thereto, in a step S7 as described above.

In step S64, the frame synchronization determination unit 53 determines whether or not it is the timing for the top position of the frame, and repeats the same process until the timing for the top position of the frame is reached. When it is regarded that the timing of the top position of the frame is reached in step S64, the process proceeds to step S65.

In step S65, the frame synchronization determination unit 53 generates a frame start signal at the timing for the top position of the frame and supplies the channel inversion control unit 35 therewith. By this process, the channel inversion control unit 35 switches the I channel signal and the Q channel signal as to the input signals successively supplied thereto, at the timing when the frame start signal is supplied, as described with reference to steps S8 and S9 described above.

Figure 8:
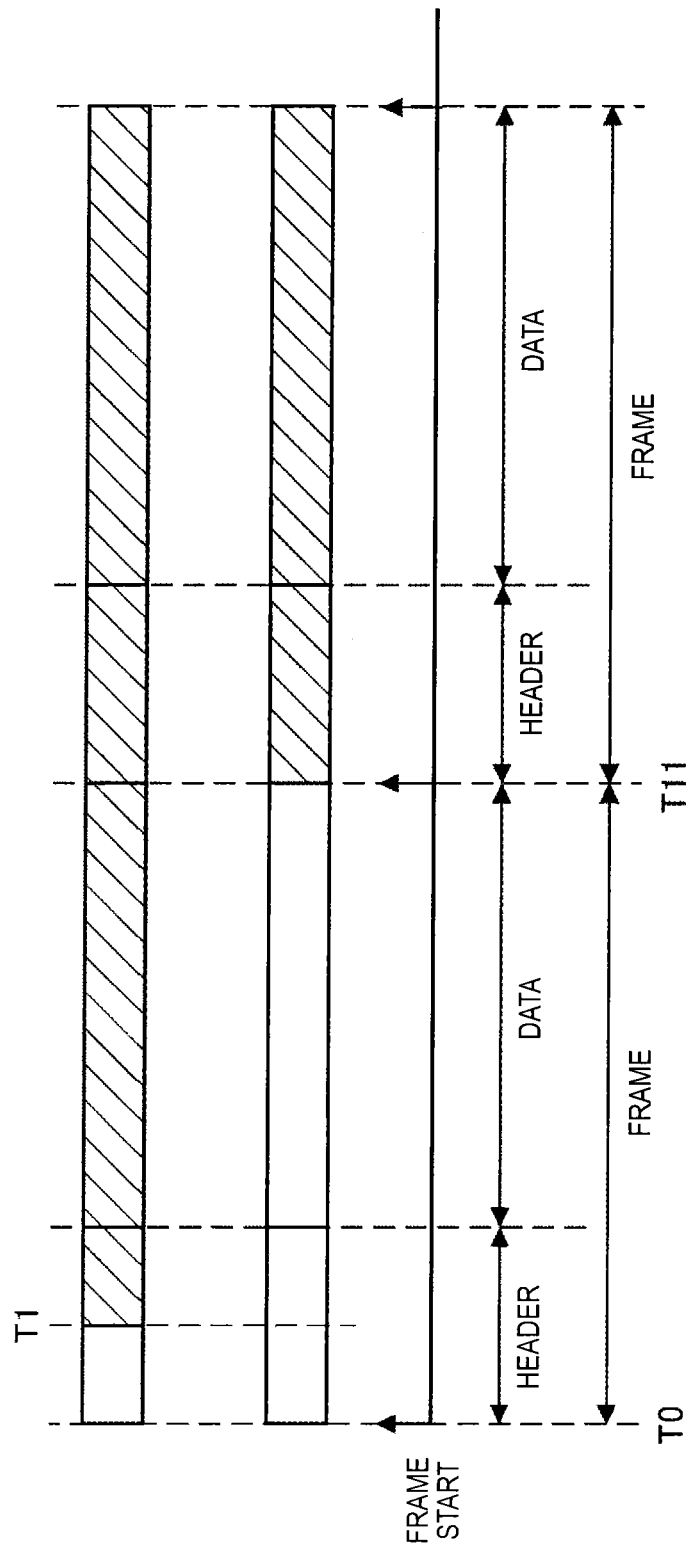
FIG. 8 is a diagram explaining a reason for switching channels at timing when a frame start signal is supplied.

That is, if the I channel signal and the Q channel signal are switched at the timing when the frame start signal is supplied thereto, for example, as shown at time T1 in the upper part of FIG. 8, the I channel signal and the Q channel signal are to be switched in the middle of reading of a header portion, resulting in the reading of the header portion susceptible to errors. Meanwhile, as shown at time T11 in the center part of FIG. 8, the I channel signal and the Q channel signal are to be switched at the timing when the frame start signal is supplied thereto, so that the switching can be performed at the timing when the demodulation of the top position of the header portion is started, and therefore, it is possible to suppress the occurrence of errors. It should be noted that FIG. 8 shows the read timing of the sequence of the header portion and the data portion frame-by-frame, in which the shaded area shows the range of demodulation after the switching of the I channel signal and the Q channel signal. Further, the state of reading the header portion at the timing different from the frame start is shown in the upper part of FIG. 8, and in the middle part thereof, the state of reading the header portion at the timing of the frame start is shown. Further, in the lower part of FIG. 8, frame start timing is indicated by arrows.

Meanwhile, in step S62, the channel inversion detection unit 51 determines that channels of the input signal have not been inverted if the value of the imaginary part of the correlation value at peak timing is equal to or greater than zero, under the condition that $\Delta\theta$ falls within the range of $\pm\pi/2$. As a result, the processes of steps S63 through S65 are skipped. That is, the channel inversion detection unit 51 does not output a channel inversion detection result indicating that the channels of the input signal are inverted, to the channel inversion control unit 35. Alternatively, the channel inversion detection unit 51 outputs a channel inversion detection result indicating that the channels of the input signal are not inverted, to the channel inversion control unit 35. In the same way, the frame synchronization determination unit 53 does not output a frame start signal to the channel inversion control unit 35, either. As a result, the channel signals are not switched and the subsequent demodulation process is continued, as described in step S10 in FIG. 3.

On the other hand, in step S61, if the power of the correlation value is determined to be less than a predetermined threshold, the channel inversion detection unit 51 assumes that the reliability of the correlation value is low, and the process proceeds to step S66.

In step S66, based on the signal from the error correction unit 39 and the frame synchronization determination unit 53, the channel inversion detection unit 51 determines whether or not frame synchronization and decoding synchronization are both established. In step S66, if it is determined that either the frame synchronization or the decoding synchronization is not established, the process proceeds to step S67.

In step S67, the channel inversion detection unit 51 determines whether or not a predetermined time period has elapsed. If it is determined that the predetermined time period has not elapsed, that is, if the predetermined time period has not elapsed under a state where neither the decoding synchronization nor the frame synchronization is established, the process returns to step S66. Then, the processes of steps S66 and S67 are repeatedly executed until it is determined both frame synchronization and decoding synchronization have been established in step S66, or until it is determined that a predetermined time period has elapsed in step S67.

On the other hand, if it is determined, in step S67, that a predetermined time period has elapsed, i.e., that a predetermined time period has elapsed under the state in which neither the decoding synchronization nor the frame synchronization is established, the process proceeds to step S68.

In step S68, the channel inversion detection unit 51 generates a channel inversion detection signal indicating that the inversion of the channels occurs, and supplies the channel inversion detection signal to the channel inversion control unit 35.

In step S69, the frame synchronization determination unit 53 determines whether or not the timing of the top position of the frame arrives, and repeats the same process until the arrival of the timing of the top position of the frame. When it is regarded, in step S69, that it is proper timing of the top position of the frame, the process proceeds to step S70.

In step S70, the frame synchronization determination unit 53 generates a frame start signal at the timing of the top position of the frame, and supplies the frame start signal to the channel inversion control unit 35, and the process returns to step S66. That is, as described with reference to the above steps S8 and S9, by this process, the channel inversion control unit 35 switches the I channel signal and the Q channel signal at the timing when the frame start signal is supplied, with regard to the input signal sequentially supplied thereto.

Then, in step S66, the processes in steps S66 through S70 are repeatedly executed until it is determined that both the decoding synchronization and the frame synchronization are established. In other words, the channels of the input signal are switched at predetermined time intervals until the decoding synchronization and the frame synchronization are established.

On the other hand, in step S66, if it is determined that both of the decoding synchronization and the frame synchronization are established, the channel control process is terminated.

Thus, if it is determined that the power of the correlation value is large and the reliability of the correlation value is high, switching of the channels of the input signal is controlled based on the correlation value, and if it is determined that the power of the correlation value is small, and the reliability of the correlation values is low, switching of the channels of the input signal is controlled without using the correlation value, based on the state of the subsequent frame synchronization and the decoding synchronization. Thus, it is possible to perform the switching of the channels of the input signal with higher accuracy.

In steps S66 through S70, there has been described an example for determining whether or not to synchronize both of the decoding synchronization and the frame synchronization, however, switching of the channels of the input signal may be controlled based on the state of only one of them.

Also, the reliability of the correlation value may be determined based on the magnitude of the direct correlation value instead of the power of the correlation value.

Further, the reliability of the correlation value may be determined based on whether or not the argument of the correlation value is within a predetermined range, instead of the power of the correlation value. That is, in step S61, the channel inversion detection unit 51 may determine whether the argument of the correlation value is within a predetermined range, and then, determine the reliability of the correlation value on the basis of the determination result. In particular, if the condition of the following expression (4) is met when the argument of the correlation value is expressed within a range from $-\pi$ to $\pi$, i.e., if the argument of the correlation value is within a range indicated by hatched lines in FIG. 9, the channel inversion detection unit 51 determines that the argument of the correlation value is within the predetermined range, and accordingly, the reliability of the correlation value is regarded as sufficiently high, and the process may proceed to step S62, and the process S62 and following processes may be executed.

$$\alpha \leq |\text{argument of the correlation value}| \pi - \alpha \quad (4)$$

That is, for example, if the value of $\Delta\theta$ is small and with a little variation, and the deflection angle of the correlation value is closer to $\pm\pi/2$, the reliability of the correlation value is determined to be high, and switching of the channels of the input signal is controlled based on the value of the imaginary part of the correlation value.

Figure 9:
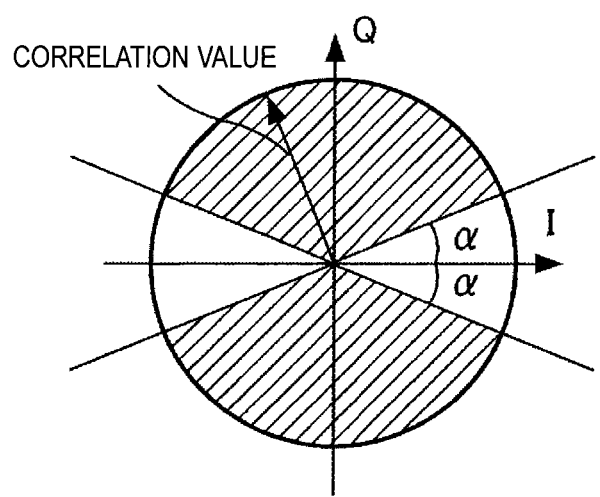
FIG. 9 is a diagram for explaining a determination process of step S61 in FIG. 6.

Therefore, in this case, in step S61, if the argument of the correlation value does not satisfy the condition of the expression (4), i.e., the argument of the correlation value is outside the range indicated by hatched lines in FIG. 9, the channel inversion detection unit 51 determines the argument of the correlation value is outside the predetermined range, so that the reliability of the correlation value is considered to be low. Then the process proceeds to step S66, and also the processes of steps S66 onward are executed.

That is, for example, if the value of $\Delta\theta$ is large or with larger variation and the argument of the correlation value is closer to zero or $\pi$, the reliability of the correlation value is determined to be low, and switching of the channels of the input signal is controlled not using the correlation value but based on the results of frame synchronization and decoding synchronization in the subsequent stage. Thus, it becomes possible to perform the switching of the channels of the input signal with higher accuracy.

Further, in the above discussion, an example is described in which, when the reliability of the correlation value is low, channels are switched until both the frame synchronization and the decoding synchronization are established; however, it is also possible to regard the reliability of the correlation value to be high, and to omit the processes of steps S61, and S66 through S70. Accordingly, if the channels of the input signal are inverted, the switching of channels of the input signal can be controlled based on the correlation value of the calculation results in the middle of the frame synchronization, without waiting for the result of the decoding synchronization by the error correction unit 39 and the result of the frame synchronization in the frame synchronization determination unit 53, so that correct demodulation of the input signal can be performed more quickly.

As it is possible to determine whether or not the value of the imaginary part of the correlation value is equal to or greater than zero, for example, by the determination result of whether the uppermost bit of the correlation value is one or zero, the determination process can be realized with a simple circuit configuration, and a smaller circuit can be achieved.

Further, the time required for establishing the frequency and clock synchronization is generally only necessary until the first synchronization is established, and is substantially zero once the synchronization is established while the state is maintained. Therefore, as in the demodulation device 14 of FIG. 1, the channel inversion control unit 35 for switching the I channel signal and the Q channel signal is provided at the downstream configuration for establishing the synchronization of the frequency and the clock, so that even if the channels of the input signal are inverted, it is possible to switch the channels, while maintaining the state in which the frequency and clock synchronization is established. Thus, it becomes possible to prevent the delay of demodulation according to the establishment of the synchronization of the frequency and the clock. That is, if the I channel signal and the Q channel signal have been inverted and are to be switched, the delay to be considered is only the time from the timing at which the inversion of the channels is detected, to the timing at which the frame start signal is transmitted. Consequently, even if inversion of the I channel signal and the Q channel signal has occurred, the time required for the demodulation process can be substantially equal to the time when the inversion of the I channel signal and the Q channel has not occurred.

Further, in the above discussion, an exemplary configuration is described in which the channel inversion control unit 35 is arranged between the reception filter 34 and the equalizer 36; however, it is also possible to obtain the similar effect as described in the above with the arrangement in another location, if it is within a range within the downstream of the frequency synchronization unit 32 and the clock synchronization unit 33 and the upstream of the error correction unit 39. That is, arrangement in any location will do if it is in the downstream of the configuration for establishing the synchronization of the frequency and the clock and the upstream of the error correction unit 39 that confirms the decoding synchronization state of the TS, which is the final data.

Further, the method of calculating the correlation value is not limited to the above-described method, and there can be employed other methods capable of calculating the correlation value showing the direction and magnitude of the correlation of the known delay detection sequence and the received delay detection sequence.

In the above description, there has been described an example of using a value obtained by adding the correlation value for each delay detection value for the determination of whether or not to switch the channels of the input signal; however, for example, using the average value of the correlation values for the values of the respective delay detection is also possible.

In addition, even if the correlation value between the known delay detection sequence and the received delay detection sequence corresponding to the known sequence is not necessarily the peak value due to the impact of the noise and frequency error, it can be determined whether or not the channels of the input signal is inverted, based on the value of the imaginary part of the correlation value between the known delay detection sequence and the received delay detection sequence corresponding to the known sequence.

The present technique can be applied, for example, to a demodulation device for demodulating a signal modulated by the DVB-S.2 standard, and also to a device including the demodulation device (e.g., satellite broadcast receiving device).

Further, the present technique can be applied to a demodulation device for demodulating an input signal modulated by the standard in which the difference of the correlation between the received sequence and the known sequence appears clearly in the cases where the channels of the input signal are inverted and not inverted, in addition to of the DVB-S.2 standard, and a device including the demodulation device.

The series of processes described above can be executed by hardware but can also be executed by software. When the series of processes is executed by software, a program that constructs such software is installed into a computer. Here, the expression "computer" includes a computer in which dedicated hardware is incorporated and a general-purpose personal computer or the like that is capable of executing various functions when various programs are installed.

FIG. 10 is a block diagram showing a hardware configuration example of a computer that performs the above-described series of processes using a program.

In the computer, a central processing unit (CPU) 1001, read only memory (ROM) 1002 and random access memory (RAM) 1003 are mutually connected by a bus 1004.

An input/output interface 1005 is also connected to the bus 1004. An input unit 1006, an output unit 1007, a storage unit 1008, a communication unit 1009, and a drive 1010 are connected to the input/output interface 1005.

The input unit 1006 is configured from a keyboard, a mouse, a microphone or the like. The output unit 1007 is configured from a display, a speaker or the like. The storage unit 1008 is configured from a hard disk, a non-volatile memory or the like. The communication unit 1009 is configured from a network interface or the like. The drive 1010 drives a removable medium 1011 such as a magnetic disk, an optical disk, a magneto-optical disk, semiconductor memory or the like.

In the computer configured as described above, the CPU 1001 loads a program that is stored, for example, in the storage unit 1008 onto the RAM 1003 via the input/output interface 1005 and the bus 1004, and executes the program. Thus, the above-described series of processes is performed.

Programs to be executed by the computer (the CPU 1001) are provided being recorded in the removable medium 1011 which is a packaged medium or the like. Also, programs may be provided via a wired or wireless transmission medium, such as a local area network, the Internet or digital satellite broadcasting.

Then, by inserting the removable medium 1011 into the drive 1010, the program can be installed in the storage unit 1008 via the input/output interface 1005. Further, the program can be received by the communication unit 1009 via a wired or wireless transmission medium and installed in the storage unit 1008. Moreover, the program can be installed in advance in the ROM 1002 or the storage unit 1008.

It should be noted that the program executed by a computer may be a program that is processed in time series according to the sequence described in this specification or a program that is processed in parallel or at necessary timing such as upon calling.

Further, in the present technique, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

An embodiment of the present technique is not limited to the embodiments described above, and various changes and modifications may be made without departing from the scope of the present technique.

For example, the present technique can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1)

A demodulation device that demodulates an input signal split into two signals of an I channel and a Q channel, the demodulation device including:

a frequency correction unit that corrects a frequency of the input signal and synchronizes the frequency;

an inversion detection unit that detects the I channel and the Q channel of the input signal are inverted; and a channel control unit that switches, if it is detected that the I channel and the Q channel are inverted by the inversion detection unit, the I channel and the Q channel at a downstream of the frequency correction unit.

(2)

The demodulation device according to (1), wherein the channel control unit switches channels of the input signal at timing from which a frame of the input signal changes.

(3)

The demodulation device according to (1) or (2), wherein the channel control unit again switches channels of the input signal, if frame synchronization to the input signal is not established within a predetermined time period after switching channels of the input signal.

(4)

A demodulation method of a demodulation device that demodulates an input signal split into two signals of an I channel and a Q channel, the demodulation method including the steps of:

executing a frequency correction process that corrects frequency of the input signal and synchronizes the frequency;

executing an inversion detection process that detects the I channel and the Q channel of the input signal are inverted; and executing a channel control process that switches, if it is detected that the I channel and the Q channel are inverted in the inversion detection process, the I channel and the Q channel in a downstream process of the frequency correction process.

(5)

A program for causing a computer controlling a demodulation device that demodulates an input signal split into two signals of an I channel and a Q channel, to function as:

a frequency correction unit that corrects a frequency of the input signal and synchronizes the frequency;

an inversion detection unit that detects the I channel and the Q channel of the input signal are inverted; and a channel control unit that switches, if it is detected that the I channel and the Q channel are inverted by the inversion detection unit, the I channel and the Q channel at a downstream of the frequency correction unit.

REFERENCE SIGNS LIST 11 antenna
12 tuner
13-1, 13-2 A/D converter
14 demodulation device
31 frequency correction unit
32 frequency synchronization unit
33 clock synchronization unit
34 reception filter
35 channel inversion control unit
36 equalizer
37 frame synchronization unit
38 phase synchronization unit
39 error correction unit
51 channel inversion detection unit
52 correlation detection unit
53 frame synchronization determination unit

The invention claimed is:

1. A demodulation device that demodulates an input signal split into two signals of an I channel and a Q channel, the demodulation device comprising:
circuitry configured to
correct a frequency of the input signal to produce a frequency-corrected input signal, synchronize the frequency-corrected input signal with a predetermined clock signal to perform clock synchronization between the I channel and the Q channel to produce a frequency-corrected and clock-synchronized input signal, and synchronize the frequency of the frequency-corrected and clock-synchronized input signal by obtaining a correction amount required to synchronize the frequency of the input signal with a predetermined frequency to perform frequency synchronization between the I channel and the Q channel to produce a frequency-corrected, clock-synchronized, and frequency-synchronized input signal;
detect whether the I channel and the Q channel of the frequency-corrected, clock-synchronized, and frequency-synchronized input signal are inverted; and
switch, if it is detected that the I channel and the Q channel are inverted, the I channel and the Q channel of the frequency-corrected, clock-synchronized, and frequency-synchronized input signal.

2. The demodulation device according to claim 1, wherein the circuitry is configured to switch the I channel and the Q channel of the input signal at a timing from which a frame of the input signal changes.

3. The demodulation device according to claim 1, wherein the circuitry is configured to again switch the I channel and the Q channel of the input signal, if frame synchronization to the input signal is not established within a predetermined time period after switching the I channel and the Q channel of the input signal.

4. A demodulation method of a demodulation device that demodulates an input signal split into two signals of an I channel and a Q channel, the demodulation method comprising the steps of:
executing, in circuitry, a frequency correction process that corrects frequency of the input signal to produce a frequency-corrected input signal, synchronizing the frequency-corrected input signal with a predetermined clock signal to perform clock synchronization between the I channel and the Q channel to produce a frequency-corrected and clock-synchronized input signal, and synchronizing the frequency of the frequency-corrected and clock-synchronized input signal by obtaining a correction amount required to synchronize the frequency of the input signal with a predetermined frequency to perform frequency synchronization between the I channel and the Q channel to produce a frequency-corrected, clock-synchronized, and frequency-synchronized input signal;
executing, in the circuitry, an inversion detection process that detects the I channel and the Q channel of the frequency-corrected, clock-synchronized, and frequency-synchronized input signal are inverted; and
executing, in the circuitry, a channel control process that switches, if it is detected that the I channel and the Q channel are inverted in the inversion detection process, the I channel and the Q channel of the frequency-corrected, clock-synchronized, and frequency-synchronized input signal.

5. A non-transitory, computer-readable storage medium storing computer-executable instructions that, when executed by a computer controlling a demodulation device that demodulates an input signal split into two signals of an I channel and a Q channel, cause the computer to perform a method comprising:
correcting a frequency of the input signal to produce a frequency-corrected input signal, synchronizing the frequency-corrected input signal with a predetermined clock signal to perform clock synchronization between the I channel and the Q channel to produce a frequency-corrected and clock-synchronized input signal, and synchronizing the frequency of the frequency-corrected and clock-synchronized input signal by obtaining a correction amount required to synchronize the frequency of the input signal with a predetermined frequency to perform frequency synchronization between the I channel and the Q channel to produce a frequency-corrected, clock-synchronized, and frequency-synchronized input signal;
detecting whether the I channel and the Q channel of the frequency-corrected, clock-synchronized, and frequency-synchronized input signal are inverted; and
switching, if it is detected that the I channel and the Q channel are inverted, the I channel and the Q channel of the frequency-corrected, clock-synchronized, and frequency-synchronized input signal.

6. The demodulation device according to claim 1, wherein the circuitry is configured to correct the frequency, synchronize the frequency-corrected input signal with the predetermined clock signal, and synchronize the frequency in a loop.

* * * * *